March 3, 1959 E. KEONJIAN 2,876,297

DIRECT-COUPLED TRANSISTOR AMPLIFIERS

Filed Jan. 7, 1953

Inventor:
Edward Keonjian,
by Charles M. Hutchins
His Attorney.

United States Patent Office 2,876,297
Patented Mar. 3, 1959

2,876,297

DIRECT-COUPLED TRANSISTOR AMPLIFIERS

Edward Keonjian, Syracuse, N. Y., assignor to General Electric Company, a corporation of New York Application January 7, 1953, Serial No. 329,965

4 Claims. (Cl. 179—171)

My invention relates to direct-coupled amplifiers, and more particularly to means for stabilizing direct-coupled transistor amplifiers against undesired drift of the operating point thereof.

Amplifier circuits utilizing controllable semi-conductor devices, commonly denominated transistors, are well known in the art and, in some instances, are used to perform functions somewhat similar to those of vacuum tubes without the attendant difficulties occasioned by the use of vacuum tubes, such as short life and fragility. However, the basic theories of the two devices are quite different and thus the transistor and vacuum tubes are not consistently analogous.

One application of vacuum tubes in the past has been the amplification of very low frequency and unidirectional signals. An amplifier constructed for this purpose requires conductive coupling between successive stages of the amplifier without the use of coupling capacitors because capacitors present a high impedance at low frequencies, and for direct currents, are open circuits and thus block the passage of a low frequency or unidirectional signal to succeeding stages.

In most direct-coupled amplifiers using vacuum tubes, the output voltage thereof has a tendency to drift even when the input voltage is held constant. That is to say, variations in the output voltage occur independently of changes in the input voltage, such variations being caused by changes in the plate supply voltages and in the cathode operating temperature.

Direct-coupled amplifiers utilizing junction transistor devices, as contrasted with so-called point-contact transistor devices as the active elements thereof, are also subject to slow uncontrollable drifts and fluctuations in the output current when the input current is maintained at a constant value. Negative feed-back of a portion of the output voltage to the input circuit partly corrects the difficulty in amplifiers, of both the vacuum tube and transistor types. However, negative feed-back cannot eliminate drift completely.

In direct-coupled junction-transistor amplifiers, undesired drift of the output current is primarily caused by changes in temperature. Two parameters of junction transistors that are particularly sensitive to temperature changes are the collector impedance and the collector current at zero emitter current, which is commonly termed the diode back current.

Accordingly, it is an object of this invention to provide novel direct-coupled amplifier circuits having junction transistor devices as the active element thereof and in which a relatively high degree of stabilization of the operating characteristics thereof is obtained with little loss in gain.

It is a further object of this invention to provide, in such amplifier circuits, means to compensate for changes in the output current of a direct-coupled junction transistor amplifier due to changes in temperature.

The objects of my invention may be realized through the provision af a non-linear circuit element such as a junction diode so arranged in the circuit of a direct-coupled transistor amplifier that compensation for the normal variation of output current with changes in ambient temperature is provided, thereby providing a direct-coupled transistor amplifier that is stable over an extended range of temperature changes.

The features of my invention which I believe to be novel are set forth with particularity in the appended claims. My invention itself, however, both as to its organization and method of operation, together with further objects and advantages thereof, may best be understood by reference to the following description taken in connection with the accompanying drawing, in which:

Figure 1:
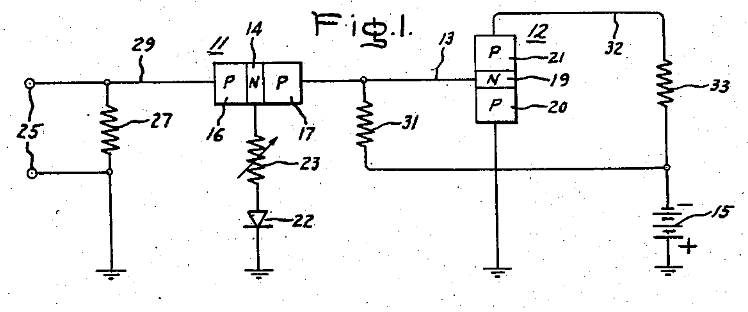
Fig. 1 is a schematic circuit diagram of a direct-coupled transistor amplifier embodying the novel features of my invention.

Referring now to Fig. 1, a direct-coupled transistor amplifier embodying my invention is shown comprising a first junction transistor 11 directly coupled to a second junction transistor 12 by a conductive connection 13. As shown, the transistors 11 and 12 are P–N–P junction transistors which may consist, as is known, of two P–N junctions arranged back to back in a single crystal so that two P type regions are separated by an N type region. Separate electrical connections are made to each region to provide the usual base, emitter, and collector electrodes 14, 16 and 17, respectively, for the transistor 11, and similar base, emitter, and collector electrodes 19, 20, 21, respectively, for the transistor 12. A source of voltage 15 provides bias for the transistors 11 and 12 and causes current flow among the electrodes thereof in a manner subsequently to be described.

While the transistors 11 and 12 have been described as being of the P–N–P type, it will be clearly understood, however, that N–P–N junction transistors can be used if desired, the latter type necessitating only a reversal of the terminals of the bias-voltage source 15, it being well known that N–P–N transistors operate similarly to the P–N–P type. The specific construction of the junction transistors 11 and 12, in and of themselves, forms no part of this invention. Methods of fabricating such devices are known to those skilled in the art and reference is hereby made to a copending application of William C. Dunlap, Jr., Serial No. 187,490, filed September 29, 1950 and assigned to the assignee of the present application, for a fuller description of such methods.

In the circuit arrangement shown in Fig. 1, the emitter electrode 16 of the transistor 11 is used as an input electrode, the collector 17 thereof is used as an output electrode, and the base electrode 14 is employed as a common electrode. Base 19 of the transistor 12 is used as the input electrode thereof, the emitter 20 being used as a common electrode, and the collector 21 being employed as the output electrode. This type of circuit arrangement of a pair of transistors is commonly termed a "grounded-base grounded-emitter" amplifier, and although the following description is drawn particularly to this arrangement, it will be clearly understood that other circuit arrangements, such as a "grounded-emitter grounded-emitter" arrangement, are well known in the art, and my invention is not to be limited to the arrangement here shown.

For stabilizing the direct-coupled transistor amplifier in accordance with my invention, a junction diode 22 and a series connected variable resistor 23 are connected in the base circuit of the transistor 11. The junction diode 22 may be of any suitable conventional type such as the kind described in the above-noted application of W. C. Dunlap, Jr. The reverse resistance of the diode 22, that is, the resistance of the diode when poled in a direction so as to oppose current flow, is normally subject to variations in magnitude in response to variations in temperature. The order of magnitude of this reverse resistance is 200,000 ohms. The forward resistance is much lower, being of the order of 10 ohms and does not vary greatly with temperature. The junction diode 22 is connected in the base circuit of the transistor 11 and poled against normal current flow, that is, so that it offers its high reverse impedance to normal current flow in the circuit. Thus, the flow of current through the diode 22 is subject to incremental changes in magnitude in response to temperature variations.

A signal voltage to be amplified is applied from any suitable source (not shown) to input terminals 25 and appears as an input voltage across an input resistor 27. This input voltage is directly fed to the emitter 16 of the transistor 11 as by a conductor 29. The collector electrode 17 of the transistor 11 is connected through a load resistor 31 to the negative terminal of the source of voltage 15, the positive terminal of which is grounded. This connection provides the necessary bias to produce amplification of the applied signal. The required bias for the emitter 16 of transistor 11 is supplied by the current flowing through a circuit including the resistance 27 in the emitter base circuit and also including the conductor 29, the emitter 16, the base 14, resistance 23, diode 22, and ground.

The resistor 23 is preferably adjustable and is connected in series with the diode 22 to control the amount of compensation applied by the diode 22, the compensation varying inversely with the amount of resistance that is included in series with the diode. This change in compensation, as will appear, occurs because the diode 22 acts as a variable resistor, and if the variable resistance is only a small part of the total branch resistance, the effect of any variation therein on the remaining portions of the circuit will be small, while if the variable resistance is a large part of the branch resistance, the converse is true.

Collector 17 of transistor 11 is directly coupled to the base 19 of the transistor 12 by the conductor 13, as noted above, and the amplified signal is directly fed through conductor 13 to the base 19 without intervening capacitors or transformers. The collector 21 of the transistor 12 is biased by the voltage source 15. The signal as amplified by the transistor 12 is fed directly through a conductor 32 to an output load resistor 33 to which any desired utilization circuit can be connected.

Figure 2:
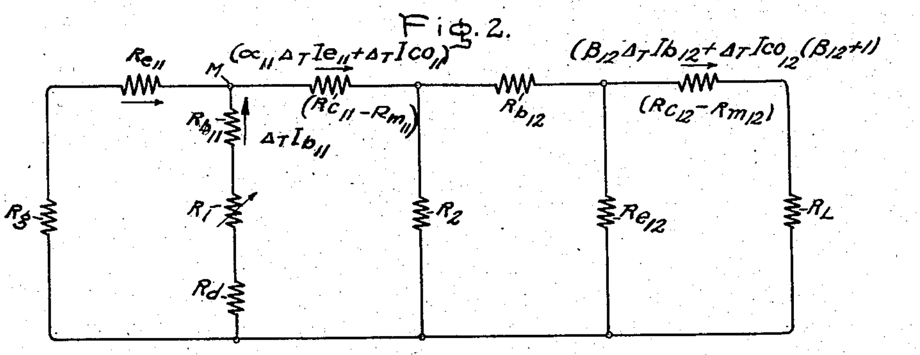
Fig. 2 is an equivalent circuit diagram corresponding to the amplifier illustrated in Fig. 1 and useful in explaining the theory of operation thereof.

The effect of the junction diode 22 on the amplifier circuit can best be understood by reference to Fig. 2, which is an equivalent circuit diagram of the amplifier illustrated in Fig. 1. The equivalent representation of the transistor 11 comprises an emitter resistance $Re_{11}$, a base resistance $Rb_{11}$, and a resistance $Rcm_{11}$ in the collector branch of the transistor that is equal to $Rc_{11}$—$Rm_{11}$, where $Rc_{11}$ is the collector impedance of transistor 11 and $Rm_{11}$ is a fictitious resistance which denotes that an electromotive force having a value substantially proportional to the emitter current is generated in the collector branch of transistor 11. Similarly, the equivalent circuit representation of the transistor 12, connected as a grounded-emitter stage, includes a base resistance $Rb_{12}$, an emitter resistance $Re_{12}$, and a resistance $Rcm_{12}$ in the collector branch of the transistor that is equal to $Rc_{12}$—$Rm_{12}$, where $Rc_{12}$ is the collector impedance of transistor 12 and $Rm_{12}$ is a fictitious resistance that denotes that an electromotive force is generated in the collector branch of the transistor 12 whose value is substantially proportional to the emitter current. The quantities $Rm_{11}$ and $Rm_{12}$ are constants of proportionality having the dimensions of impedance, and are termed mutual impedances because of the fact that an effect is caused in each collector circuit that is proportional to the emitter current of the respective transistor. The mutual impedances can be expressed as follows:

$$Rm_{11}=Rx_{11}-Rxy_{11}$$

and $$Rm_{12}=Ryx_{12}-Rxy_{12}$$

where (the subscripts in the above equations designate the respective transistor circuits) $R_{xy}$ is the ratio of the signal voltage appearing between the emitter and the base to the signal current flowing in the collector circuit when the emitter circuit is effectively open, and $R_{yx}$ is the ratio of the signal voltage appearing between the collector and the base to the signal current flowing in the emitter circuit when the collector circuit is effectively open.

Resistances $R_g$, $R_1$, $R_2$ and $R_L$ in the equivalent circuit of Fig. 2 correspond respectively to the resistors 27, 23, 31, and 33 of the schematic diagram of Fig. 1. Resistance $R_d$ represents the reverse resistance of the diode 22. The directions of the currents in the several branches of the equivalent circuit are assumed as indicated in Fig. 2 by the arrows, which, in turn, are identified by appropriate subscripts to the symbol I.

It can be shown by junction-transistor theory that the change in collector current of the transistor 11 for a change in temperature can be expressed as follows:

$$\Delta_T Ic_{11}=\alpha_{11}\Delta_T I\epsilon_{11}+\Delta_T Ico_{11} \qquad (1)$$

where:

$\Delta_T I$ generally signifies an incremental current due to a temperature variation;

$\alpha$ generally is the current amplification factor of a transistor commonly defined as the rate of change of collector current with respect to the emitter current with the collector base voltage held constant or $$\alpha_{11}=\left|\frac{\partial I\epsilon_{11}}{\partial Ic_{11}}\right| Vc_{11}$$

and $Ico_{11}$ is the collector current of the transistor 11 with zero emitter current.

The current relation at the point M (Fig. 2) can be expressed as follows:

$$\Delta_T Ic_{11}=\Delta_T I\epsilon_{11}-\Delta_T Ib_{11} \qquad (2)$$

Solving for $\Delta_T I\epsilon_{11}$ in Equation 2 and substituting (2) in (1), we have $$\Delta_T Ic_{11}=\alpha_{11}(\Delta_T Ic_{11}-\Delta_T Ib_{11})_T\Delta_T Ico_{11}=-\Delta_T Ib_{11}\frac{\alpha_{11}}{1-\alpha_{11}}+\frac{\Delta_T Ico}{1-\alpha_{11}} \qquad (3)$$

However, the change in the base current caused by a change in temperature is approximately equal to the change in the current flowing through the diode 22 resulting from the change in the diode resistance $R_d$ caused by the same change in temperature. This is true because the reverse resistance $R_d$ of the diode 22 is temperature sensitive and changes greatly in response to a temperature change. This may be expressed as follows:

$$\Delta_T Ib_{11}\cong\Delta_T Id \qquad (4)$$

Substituting (4) in (3), we have $$\Delta_T Ic_{11}=-\Delta_T Id\frac{\alpha_{11}}{1-\alpha_{11}}+\frac{\Delta_T Ico_{11}}{1-\alpha_{11}}=-\frac{1}{1-\alpha_{11}}(\alpha_{11}\Delta_T Id-\Delta_T Ico_{11} \qquad (5)$$

In order that the output of transistor 11 be stabilized, it is necessary that the change of collector current caused by a change in temperature, $\Delta_T Ic_{11}$, be equal to zero, or expressed algebraically:

$$\Delta_T Ic_{11}=0 \qquad (6)$$

Substitution of Equation 6 into Equation 5 indicates that the necessary condition for stabilization is equality of the change in current through the diode 22 caused by a variation in the resistance thereof in response to a change in temperature multiplied by the current amplification factor $\alpha_{11}$ to the change in diode back current of the transistor 11 in response to the same change of temperature. Expressed analytically, this condition is as follows:

$$\alpha_{11}\Delta_T Id=\Delta_T Ico_{11} \qquad (7)$$

Now in a multi-stage amplifier, if only the output of the first stage is compensated for temperature variations, the output of the last stage, and thus the entire amplifier, is not automatically compensated.

Therefore, in accordance with the present invention, I compensate the second stage and, accordingly, the entire amplifier by undercompensating the first stage, i. e., by selecting a diode 22 to provide a value of $\alpha_{11}\Delta_T Id$ that is less than $\Delta_T Ico_{11}$ by such an amount as to make the output current of the amplifier substantially independent of changes in temperature. Since the output current of the amplifier can be shown to be, by derivation similar to that employed for Equation 5:

$$\Delta_T Ic_{12}=\frac{\beta_{12}}{1-\alpha_{11}}(\alpha_{11}\Delta_T Id-\Delta_T Ico_{11})+\Delta_T Ico_{12}(\beta_{12}+1) \qquad (8)$$

where $$\beta_{12}=\frac{\alpha_{12}}{1-\alpha_{12}} \qquad (9)$$

Then, assuming that $\beta_{12}>>1$, and substituting (4) in (8), we have $$\Delta_T I_L=\beta_{12}\left[\frac{1}{1-\alpha}(\alpha_{11}\Delta_T Id-\Delta_T Ico_{11})+\Delta_T Ico_{12}\right] \qquad (10)$$

To stabilize the output of the amplifier in response to temperature variation, the change in load current caused by a change in temperature $\Delta_T I_L$, must be equal to zero, or:

$$\Delta_T I_L=0 \qquad (11)$$

Substituting (11) in (10), the relationship for complete compensation of the output of the amplifier becomes:

$$\frac{1}{1-\alpha_{11}}(\alpha_{11}\Delta_T Id-\Delta_T Ico_{11})=-\Delta_T Ico_{12} \qquad (12)$$

Equation 12 gives the relationship that exists among the circuit elements when stabilization of the output current is effected. For any selected pair of transistors, the terms $\alpha_{11}$, $\Delta_T Ico_{11}$ and $\Delta_T Ico_{12}$ of Equation 12 are fixed. The value of $\Delta_T Id$ depends on the temperature-current characteristics of the diode 22 and can be varied by selecting a different diode. Thus to stabilize the output current of the amplifier, the diode 22 is selected so that the relationship established by the Equation 12 is satisfied. The varying of the resistance 23 accomplishes the same result as does the selecting of the current temperature characteristic of the diode 22 because the resistance 23 controls the effect of a variation of diode resistance as hereinbefore described.

Examination of Equation 12 shows that if the output current of the amplifier is to be exactly compensated the collector current of the transistor 11 must be undercompensated. This is true because the algebraic sign of $\Delta_T Ico_{12}$ on the right hand side of Equation 12 is negative. Thus, to make the left hand side of Equation 12 equal to the right hand side, the sign of the left hand side must also be negative. Since the coefficient of the term inclosed in parentheses is positive, the sign of the terms inside the parentheses must be negative. This can only be true if the absolute value of $\alpha_{11}\Delta_T Id$ is less than the absolute value of $\Delta_T Ico_{11}$, because the latter term is negative and the former term is positive.

To illustrate the degree of compensation of the output current obtained, the percentage variation of uncompensated output current with temperature can be compared to the variation of the compensated output current with temperature. For a temperature change from 30° C. to 50° C. the output current of an uncompensated amplifier varies by as much as 70% of the original value while the output current of the compensated amplifier varies only 1%.

Figure 3:
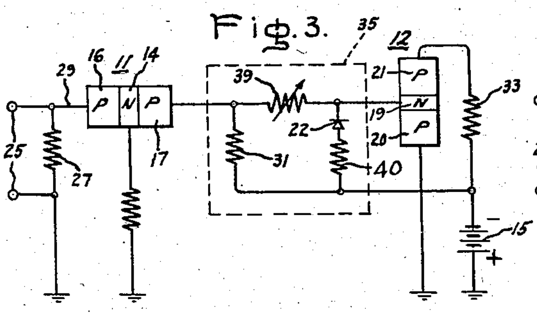
Fig. 3 is a circuit diagram of a modification of the amplifier illustrated in Fig. 1.
Figure 4:
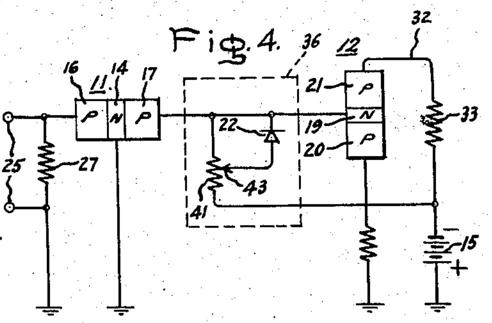
Fig. 4 is a wiring diagram of a second modification of the amplifier illustrated in Fig. 1.
Figure 5:
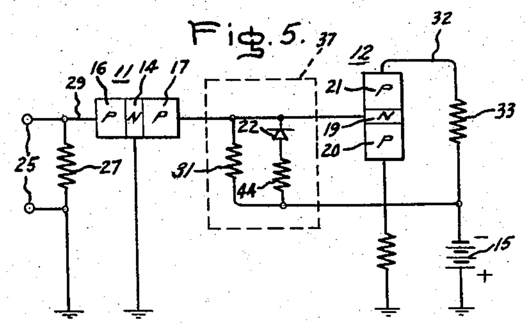
Fig. 5 is a schematic wiring diagram of a third modification of the circuit shown in Fig. 1.

Figs. 3–5 illustrate various modifications of the circuit of Fig. 1 which, for some purposes are more desirable than the amplifier of Fig. 1, inasmuch as the input resistance of the circuits shown in Figs. 3–5 can be made relatively small. Such low input impedance, it will be seen results from the fact that the diode element, employed for compensation, is connected in the interstage coupling instead of in the base-electrode circuit of the input stage as described in connection with the embodiment of Fig. 1. A low input resistance is desirable, as is well known, in current meters and similar devices.

Components of the circuits of Figs. 3–5 that are similar to corresponding components of the circuit of Fig. 1 are identified by corresponding reference numerals. Generally considered, each of the modifications shown in Figs. 3–5 comprises a voltage divider network as at 35 (Fig. 3), 36 (Fig. 4) or 37 (Fig. 5), which is connected between transistors 11 and 12 to alter the bias of the base 19 of the transistor 12 relative to the emitter 20 thereof. The arrangements are such that a change in the bias of the base 19 produces a change in the value of the collector current of transistor 12. This occurs because the operating point of the transistor 12 is changed and thus enables temperature stabilization of the amplifier circuit when the voltage divider network is properly adjusted.

It will also be observed that the diode 22 is included as part of each of the voltage divider networks employed in the circuits of Figs. 3–5 and, as the temperature varies, the resistance of the diode 22 varies inversely therewith.

Referring more particularly to Figs. 3, the voltage divider 35, as shown, comprises a variable resistance 39 connected between the collector 17 of the transistor 11 and the base 19 of the transistor 12. The load resistor 31 of the transistor 12 is connected between the collector 17 of the transistor 11 and the negative terminal of the battery 15. The diode 22 is connected in series with a resistor 40 and the series combination thereof is connected from the base 19 of the transistor 12 to the negative terminal of the battery 15. The diode 22 is connected so that the normal flow of current in the circuit is opposed. If the temperature rises the resistance of the diode 22 decreases, and this decrease in resistance causes an increase of current in the branch of the voltage divider 35 containing the diode 22 and a variable resistance 39. This increase of current through this branch causes an increased voltage drop across the resistor 39 which makes the base 19 of the transistor 12 more negative relative to the emitter 20. This change in bias changes the operating point of the transistor 12 in such a direction to oppose any change of collector current due to a change in temperature and thus stabilization is accomplished.

In Fig. 4, the diode 22 is connected in parallel with the load resistance 41 by a variable contact 43 and is connected in the reverse direction relative to normal current flow in the circuit. As the temperature varies the resistance of the diode 22 varies thereby causing a change in the resistance of the parallel combination of diode 22 and the resistor 41. Since the bias of the base 19 is in part determined by the resistance of the parallel combination, any change therein causes a change of bias, and this change in bias is in a direction to compensate for any change in diode back current of the transistor 12. The effect of the change of the resistance of diode 22 can be varied by adjusting the contact 43, the greater the portion of the resistor 41 that is parallel with the diode 22 the greater will be the effect of the change of diode resistance.

In the modification of Fig. 5, the voltage divider network 37 comprises the diode 22 connected in series with a resistor 44, the diode 22 being poled in the direction of difficult current flow. The series combination of the diode 22 and the resistor 44 is connected in parallel with the load resistor 31 of the transistor 11. By properly selecting the values of the resistors 44 and 31, the desired change in bias of the base 19 to stabilize the amplifier is obtained. In all other respects the operation of the circuits of Figs. 3–5 is similar to that of the circuit of Fig. 1.

While certain specific embodiments have been shown and described, it will, of course, be understood that various modifications may be made without departing from the invention. The appended claims are, therefore, intended to cover any such modifications within the true spirit and scope of the invention.

What I claim is new and desire to secure by Letters Patent of the United States is:

1. A stabilized multi-stage transistor amplifier comprising first and second junction transistors each having base, emitter, and collector electrodes, an input resistor connected between the emitter electrode of said first transistor and ground, a first fixed resistor having one terminal connected to the base electrode of said first transistor and having the other terminal connected to ground, means connecting the emitter electrode of said second transistor to ground, a source of direct voltage for establishing current flow among said electrodes and having one terminal grounded, a load resistor connected between the collector electrode of said second transistor and the ungrounded terminal of said direct voltage source, a variable resistor conductively coupled between the collector electrode of the first transistor and the base electrode of said second transistor, a second fixed resistor having one terminal connected to said collector electrode of said first transistor, a junction diode, a third fixed resistor connected in series with said junction diode, the series combination thereof having one terminal connected to the base of said second transistor, the other terminal of said second fixed resistor being connected to the other terminal of said series combination with said diode being connected to pass current in the reverse direction, and means connecting said connected terminal to said ungrounded terminal of said direct voltage source.

2. A stabilized multi-stage junction transistor amplifier comprising two junction transistors each having base, emitter, and collector electrodes, an input resistor connected between the emitter of said first transistor and ground, means connecting the base electrode of said first transistor to ground, means connecting the emitter electrode of said second transistor to ground, a source of direct voltage having one terminal grounded, a load resistor connected between the ungrounded terminal of said source of direct voltage and the collector electrode of said second transistor, a conductor directly coupling the collector electrode of said first transistor and the base electrode of said second transistor, a resistor having two fixed terminals and a variable tap, one of said fixed terminals being connected to said direct-coupling conductor, the other of said fixed terminals being connected to the ungrounded terminal of said source of direct voltage and a junction diode biased to pass current in the reverse direction connected between said direct-coupling conductor and said variable tap.

3. A stabilized transistor amplifier comprising a first and second junction transistor each having a base, an emitter, and a collector, an input resistor connected between the emitter of said first junction transistor and ground, means for connecting the base of said first transistor to ground, means directly coupling the collector of said first transistor to the base of said second transistor, a source of direct voltage having grounded and ungrounded terminals, a first resistor connected between said direct-coupling means and the ungrounded terminal of said source of direct voltage, a second resistor, a junction diode biased to pass current in the reverse direction connected in series with said second resistor, the series combination thereof being connected in parallel with said first resistor, means for connecting the emitter of said second transistor to ground, and a load resistor connected between the collector of said second transistor to said ungrounded terminal of the source of direct voltage.

4. A multi-stage stabilized transistor amplifier comprising a first and second junction transistor each having a base, and emitter and a collector, an input resistor connected between the emitter electrode of said first transistor and ground, means connecting said base of said first transistor to ground, coupling means providing a direct current path from the collector of said first transistor to the base of said second transistor, a source of direct voltage having a grounded terminal and ungrounded terminal, a load resistor connected between the collector electrode of said second transistor and the ungrounded terminal of said direct voltage source, means for connecting the emitter of said second transistor to ground, a junction diode, and means connecting said junction diode to pass current in the reverse direction between the base of said second transistor and the ungrounded terminal of said source of direct voltage, whereby the bias of said second transistor changes in response to the variation of the current passing characteristics of said junction diode to compensate for current variations in said load resistor induced by variations in ambient temperature thereby stabilizing said multi-stage amplifier.

References Cited in the file of this patent

UNITED STATES PATENTS

| | | |
|---|---|---|
| 2,313,096 | Shepard | Mar. 9, 1943 |
| 2,531,076 | Moore | Nov. 21, 1950 |
| 2,548,901 | Moe | Apr. 17, 1951 |
| 2,572,108 | Chalhoub | Oct. 23, 1951 |
| 2,622,213 | Harris | Dec. 16, 1952 |
| 2,647,957 | Mallinckrodt | Aug. 4, 1953 |
| 2,647,958 | Barney | Aug. 4, 1953 |
| 2,757,243 | Thomas | July 31, 1956 |
| 2,761,916 | Barton | Sept. 4, 1956 |

FOREIGN PATENTS

| | | |
|---|---|---|
| 150,501 | Sweden | May 26, 1953 |

OTHER REFERENCES

"The Transistor," a text published 1951 by Bell Telephone Laboratories Inc., Murray Hill, N. J., pages 188, 346, 347, 409. (Copy in Class. Div. II.)